(12) United States Patent
Wang et al.

(10) Patent No.: US 8,221,943 B2
(45) Date of Patent: Jul. 17, 2012

(54) PHOTOMASK WITH ASSIST FEATURES

(75) Inventors: Chun-Ming Wang, Fremont, CA (US);
Chen-Che Huang, Campbell, CA (US);
Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 228 days.

(21) Appl. No.: 12/729,088

(22) Filed: Mar. 22, 2010

(65) Prior Publication Data
US 2011/0229805 A1    Sep. 22, 2011

(51) Int. Cl.
*G03F 1/36* (2012.01)
*G03C 5/00* (2006.01)

(52) U.S. Cl. .......................................... 430/5; 430/394

(58) Field of Classification Search .............. 430/5, 311, 430/322, 394; 716/50–56; 355/53, 77
See application file for complete search history.

(56) References Cited

U.S. PATENT DOCUMENTS

| | | | |
|---|---|---|---|
| 6,887,625 B2 | 5/2005 | Baselmans et al. | |
| 7,033,734 B2 | 4/2006 | Chandhok | |
| 7,572,558 B2 | 8/2009 | Matsuura | |
| 7,771,903 B2 * | 8/2010 | Zhang et al. | 430/5 |
| 2008/0217726 A1 | 9/2008 | Tan et al. | |
| 2009/0233183 A1 * | 9/2009 | Moon | 430/5 |
| 2009/0233184 A1 | 9/2009 | Moon | |
| 2009/0317749 A1 | 12/2009 | Lee | |
| 2010/0225893 A1 * | 9/2010 | Krasnoperova | 355/71 |

* cited by examiner

*Primary Examiner* — Stephen Rosasco
(74) *Attorney, Agent, or Firm* — Vierra Magen Marcus & DeNiro LLP

(57) ABSTRACT

A photomask for exposure of a semiconductor wafer using dipole illumination and method of manufacturing the same is disclosed. A method of forming a pattern on a semiconductor using the photomask is also disclosed. The photomask may have an array of islands that are used for printing lines using dipole illumination. The photomask may have sub-resolution assist features (SRAF) to assist in printing the lines. The SRAF may include an array of holes.

25 Claims, 12 Drawing Sheets

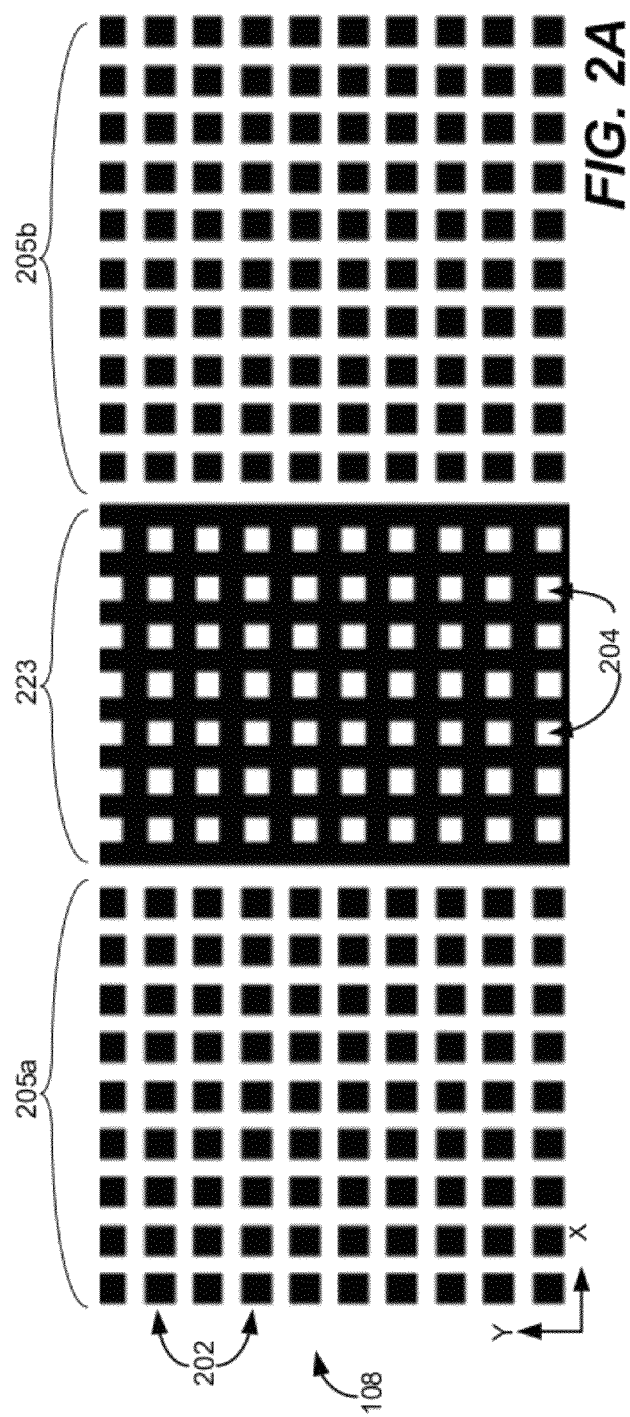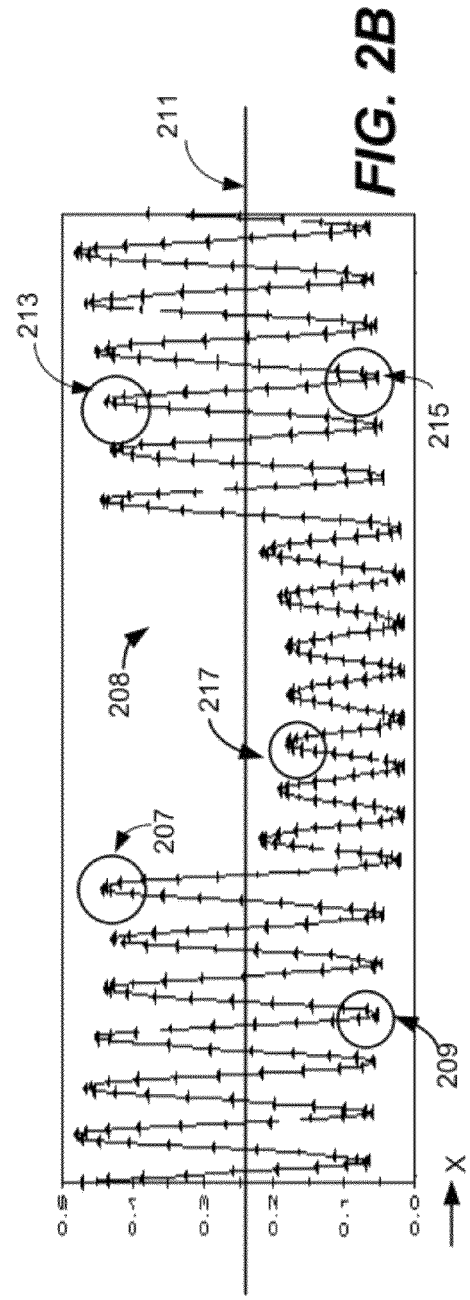

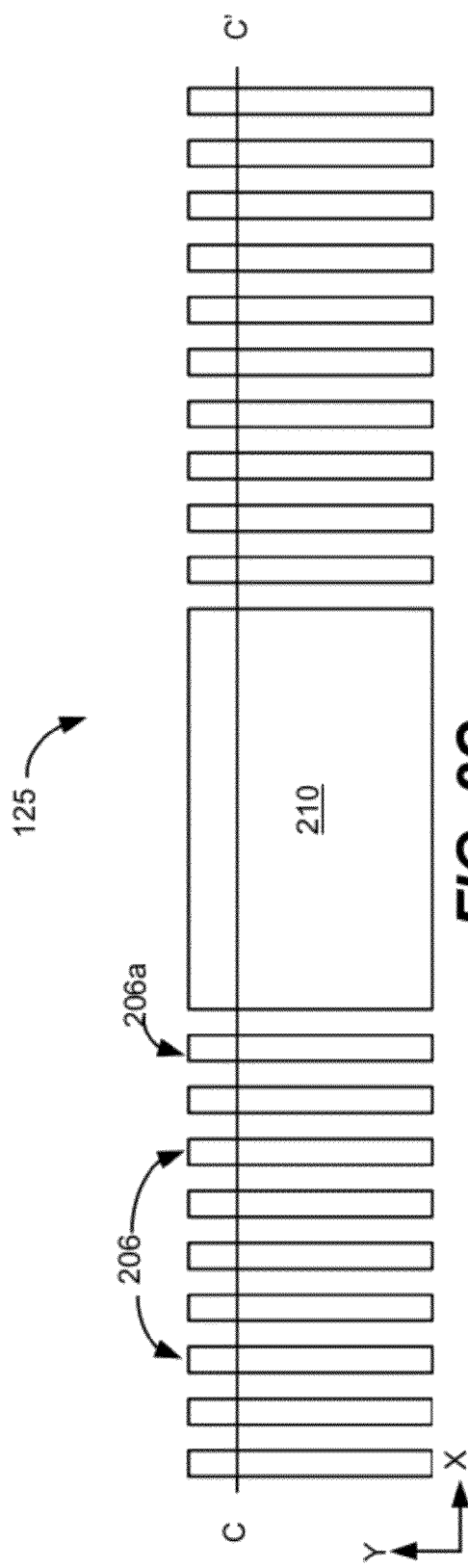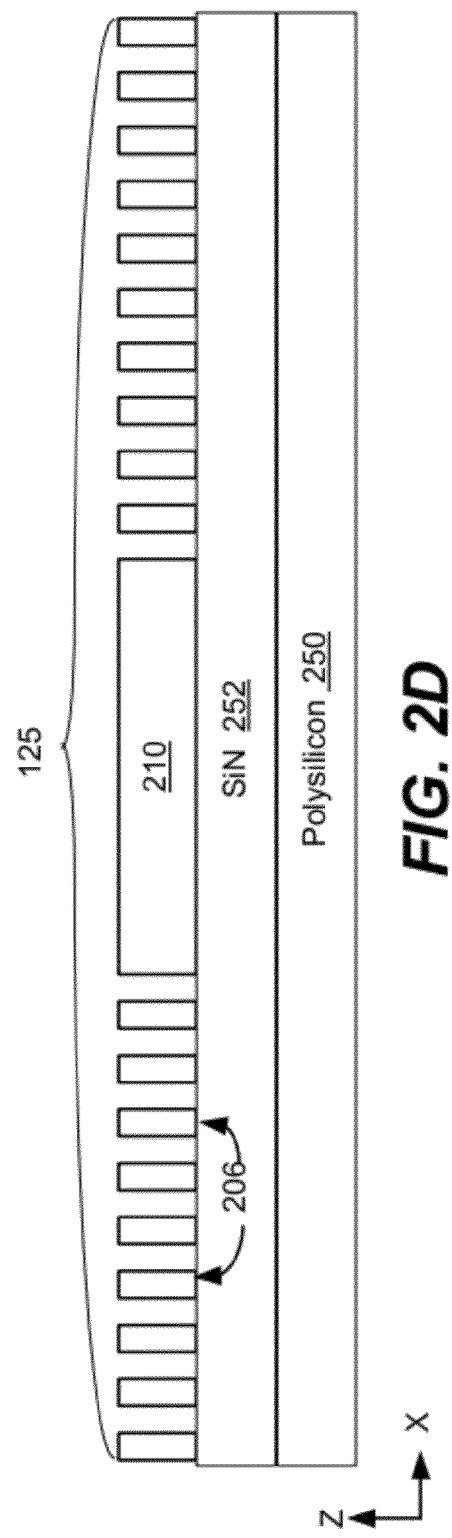

600

---

Define a first region in the photomask having an array of islands for printing lines aligned in a direction that is perpendicular to an axis of poles in a dipole illumination system —602

↓

Define a second region having a second pattern of rows and columns of assist openings —604

↓

Define a third region in the photomask having an array of islands for printing lines aligned in a direction that is perpendicular to an axis of poles in a dipole illumination system —606

PHOTOMASK WITH ASSIST FEATURES

BACKGROUND OF THE INVENTION

1. Field of the Invention

Embodiments in accordance with the present disclosure are directed to photomasks.

2. Description of the Related Art

Modern photolithography equipment is based on optical lithography, which uses optics to accurately project and expose a pattern in a photomask (or reticle) onto a photoresist-covered wafer. More specifically, the photolithography process can begin with the formation of a photoresist layer over the top surface of a semiconductor substrate or wafer. The photomask may be placed between a radiation source (e.g., light) and a projection lens system. The pattern produced by the radiation transmitted through the photomask may be focused to generate a reduced mask image on the wafer. The focusing and reduction of the mask image pattern is typically done using the projection lens system, which contains one or more lenses, filters, and/or mirrors. The radiation passing through clear regions of the photomask exposes the underlying photoresist layer. Depending upon the photoresist layer composition, the exposed portions of the photoresist can either become soluble or insoluble. Portions of the photoresist are removed to create a photoresist mask that is then used to remove portions of underlying structural layers within the wafer. The end result is a desired pattern formed on the wafer. Typically, multiple different photomasks are used to create different patterns in one or more layers on the wafer.

The resolution achieved through photolithography depends, in part, on the wavelength and coherence of the radiation source, as well as the numerical apertures (NA) of the lens within the photolithography system. Advanced photolithography uses optical enhancement techniques, such as "assist features" to improve the resolution of smaller features. Assist features are not intended to appear in the pattern developed in the resist but are provided in the photomask to take advantage of optical effects so that the developed image in the resist more closely resembles the desired pattern. Assist features are generally "sub-resolution" meaning that they are smaller in at least one dimension than the smallest feature in the photomask that will be resolved on the wafer. Note that because the pattern in the photomask may be projected with a magnification of less than 1, the assist feature in the photomask may have a physical dimension larger than the smallest feature on the wafer.

Despite advancements in using photomasks in a lithographic projection system to accurately print features on a wafer, further advancements are desired.

BRIEF DESCRIPTION OF THE DRAWINGS

FIG. 2A depicts one embodiment of a portion of a photomask.

FIG. 2B depicts relative illumination intensity of the image from the photomask of FIG. 2A.

FIG. 2C and FIG. 2D depict an example pattern that may be formed in a wafer using the photomask of FIG. 2A.

FIG. 5 is a flowchart of one embodiment of a process of forming a photomask.

DETAILED DESCRIPTION

A photomask for exposure of a semiconductor wafer using dipole illumination is disclosed. A method for manufacturing a photomask to be used for exposure of a semiconductor wafer with dipole illumination is also disclosed. A method of forming a pattern on a semiconductor using dipole illumination is also disclosed.

In one embodiment, the photomask may be used to form dense lines and edge lines. For example, the photomask can be used to form a group of densely spaced wordlines in a memory array, as well as a word line at the edge of the group of word lines.

In one embodiment, the photomask has an array of islands that are used for printing lines in a wafer. The photomask may be used in a photolithography system that uses dipole illumination. In one embodiment, the photomask has sub-resolution assist features (SRAF) to assist in printing the lines. The SRAF may include an array of holes.

Figure 1A:
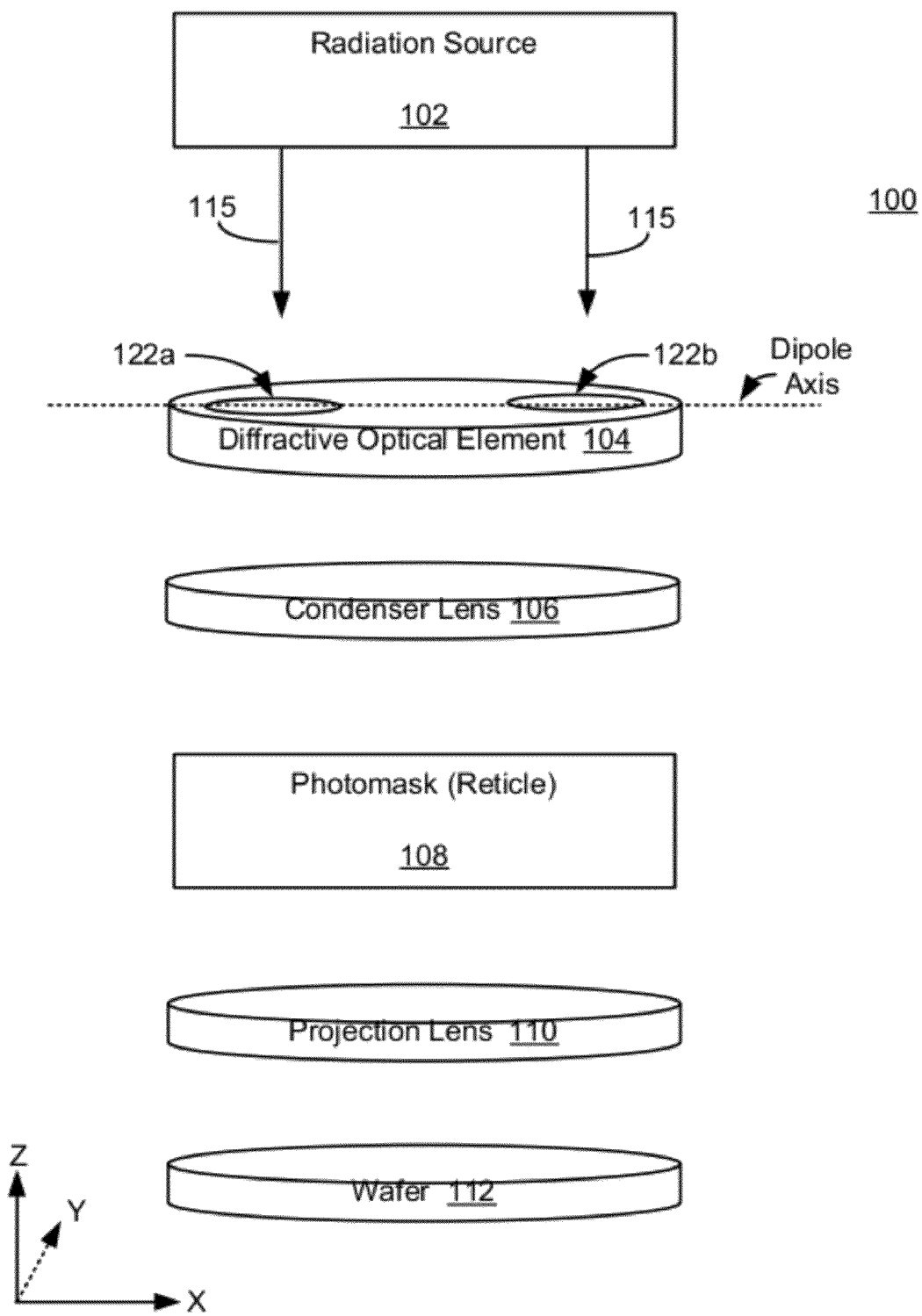
FIG. 1A depicts an example photolithography system in which one embodiment of a photomask may be used.

FIG. 1A depicts an example photolithography system 100 in which one embodiment of a photomask 108 may be used. Photomasks 108 are also commonly referred to as reticles. The photolithography system 100 is capable of dipole illumination. The system 100 includes a radiation source 102, a diffractive optical element 104, a condenser lens 106, a photomask 108, a projection lens 110, and a wafer 112 upon which a pattern is formed. The photomask 108 includes pattern that is to be formed on the wafer 112.

In general, radiation from the radiation source 102 goes through holes 122a, 122b in the diffractive optical element 104, through the condenser lens 106 and through a pattern (not depicted in FIG. 1A) in the photomask 108. An image formed by the pattern in the photomask passes through the projection lens 110 and onto the wafer 112. The wafer 122 may be coated with a photoresist (not depicted in FIG. 1A), which is exposed by the image from the photomask 108. In general, the radiation travels along the Z-axis, which may be referred to as an optical axis.

Figure 1B:
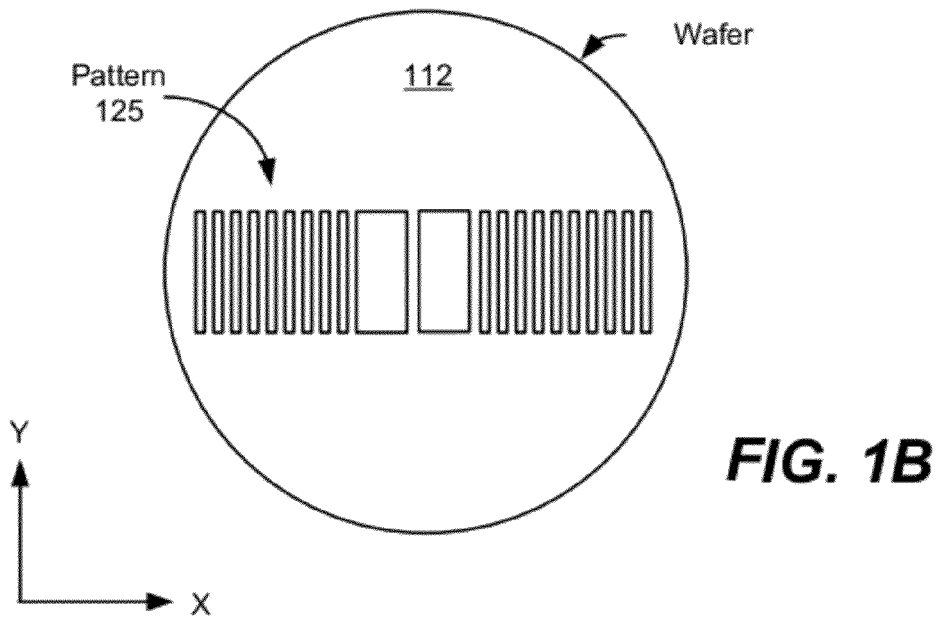
FIG. 1B is a top perspective view of one embodiment of the wafer on which a pattern having features is formed.

FIG. 1B is a top perspective view of one embodiment of the wafer 112 on which a pattern 125 having features is formed. Note that the features are aligned along the y-axis. As a non-limiting example, the features could include word lines in a memory array of a non-volatile storage device. Also, note that the pattern 125 in the wafer is greatly magnified in FIG. 1B to facilitate explanation.

Figure 1C:
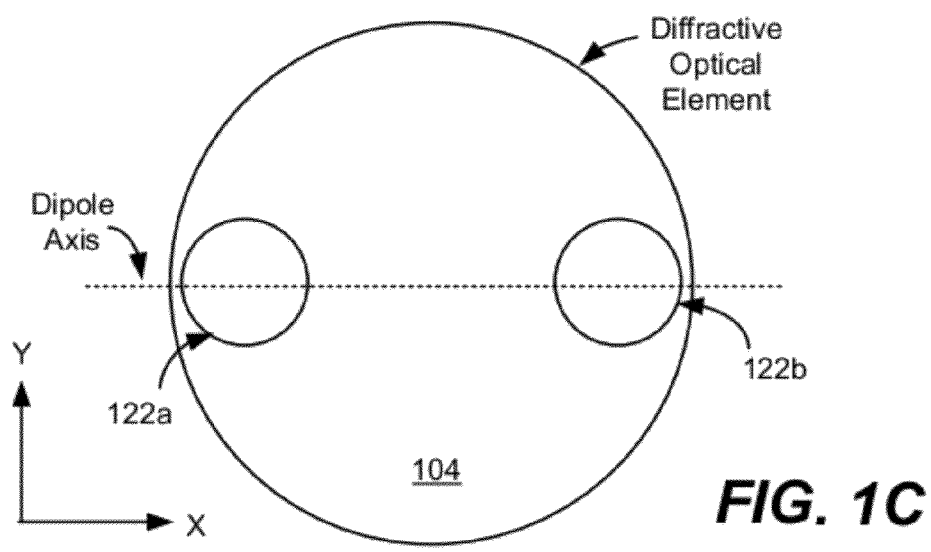
FIG. 1C depicts a top perspective view of one embodiment of the diffractive optical element of the photolithography system of FIG. 1A.

FIG. 1C depicts a top perspective view of one embodiment of the diffractive optical element 104 of the photolithography system 100 of FIG. 1A. The diffractive optical element 104 in FIG. 1C has two openings 122a, 122b along a dipole axis. The dipole axis is aligned with the x-axis. Thus, the pattern 125 being formed in the wafer 112 has features that are aligned perpendicular to the dipole axis. The openings 122a, 122b in the diffractive optical element 104 are depicted as circles, but the openings 122a, 122b can be other than circular. In general, to achieve dipole illumination, the openings 122a, 122b will be along the dipole axis. Typically, each opening 122a, 122b is the same distance from the center of the plate 104. However, the openings 122a, 122b could be closer or further from the center. The openings 122a, 122b may be of various sizes.

Dipole illumination may be used to enhance the resolution of patterns with orientations perpendicular to the axis of the dipoles. For example, the dipole axis along the x-axis may promote enhanced imaging of features formed along the y-axis. Dipole illumination is a type of off-axis illumination where two openings 122a, 122b are used as a radiation source for illuminating the photomask 108. Note that embodiments of the photomask 108 are designed to be used with dipole illumination.

Referring again to FIG. 1A, the radiation source 102 may include an energy source producing a wavelength in the ultraviolet (UV), vacuum ultraviolet (VUV), deep ultraviolet (DUV), extreme ultraviolet (EUV) range, or other wavelengths. The radiation source 102 may include any form of energy that can be propagated as waves or streams of charged particles.

The diffractive optical element 104 orients the energy produced by the radiation source 102 to result in dipole illumination. The diffractive optical element 104 achieves this by transmitting the radiation beam 115 through the first dipole opening 122a and the second dipole opening 122b. In one embodiment, the diffractive optical element 104 is a dipole aperture plate. However, other types of diffractive optical elements could be employed to create dipole illumination instead of dipole aperture plate. In one embodiment, the diffractive optical element 104 is capable of being rotated 90 degrees. Example parameters of the diffractive optical element 104 for dipole illumination are sigma-in of 0.9 and sigma-out of 0.98. In one embodiment, the numerical aperture (NA) of the optics in the lithographic system 100 is 1.35. However, other parameters could be used.

After the radiation beam 104 passes through the diffractive optical element 104, it then strikes the condenser lens 106. The condenser lens 106 helps to coalesce and/or condense the radiation transmitted through the diffractive optical element 104. By passing through the condenser lens 106 the radiation beam 104 is shaped and directed onto the photomask 108.

In one embodiment, the photomask 108 has a pattern defined by opaque regions, which may be formed of chrome, and clear regions, which may be formed of silica. The radiation beam passes through the clear regions in the photomask 108 and onto the projection lens 110. The projection lens 110 focuses the image from the photomask 108 onto the wafer 112. The projection lens 110 may reduce the size of the image from the photomask 108. For example, some scanners may reduce the size of the image from the photomask 108 by a factor of four. Therefore, the size of features in the pattern in the photomask 108 may be larger than the size of features formed in the wafer 112.

FIG. 2A depicts one embodiment of a portion of a photomask 108. The photomask 108 may be used in a photolithography system that uses dipole illumination, such as the example photolithography system 100 of FIG. 1A. The x-y axis in FIG. 2A shows one possible orientation of the photomask 108 relative to the dipole axis of FIG. 1C. FIG. 2B depicts relative illumination intensity 208 of the image from the photomask 108 of FIG. 2A.

Prior to discussing details of the photomask 108 of FIG. 2A, a pattern 215 that may be formed on a wafer 112 using the photomask 108 of FIG. 2A will be discussed. FIG. 2C and FIG. 2D depict an example pattern 215 that may be formed in a wafer 112 using the photomask 108 of FIG. 2A. FIG. 2C is a top perspective view showing densely spaced lines 206 which are aligned in the y-direction. Note that the lines 206 are aligned perpendicular to the x-axis. Recall that the dipole axis in FIG. 1C is aligned with the x-axis. Therefore, the lines 206 are aligned perpendicular to the dipole axis. In this example, there are two groups of lines 206 separated by a region 210 therebetween. Note that one of the lines 206a is an edge line in that it is not surrounded on both sides by lines 206. It can be difficult to accurately print the densely spaced lines 206 and the edge line 206a. However, embodiments of a photomask 108 are able to improve the accuracy when printing densely spaced lens and an edge line.

FIG. 2C depicts only the top photoresist layer. FIG. 2D is a cross-section taken along line C-C' of FIG. 2C. FIG. 2D depicts the pattern 125 formed in the photoresist overlaying a layer of SiN 252 and a layer of polysilicon 250. The wafer 112 may have many more layers. Note that in practice the lines 206 in the photoresist may not be as straight as depicted. Also note that the top of region 210 may not be perfectly straight. For example, there might be one or more small grooves at the very top of region 210. A reason for this is that some small amount of radiation may fall onto region 210. However, the photomask 108 is constructed such that enough of the photoresist in region 210 will remain intact to serve as a mask when etching layers below. In one embodiment, the photoresist is used as a mask when etching the SiN 252, which in turn is used as a mask when etching the polysilicon 250. Therefore, the pattern 125 may be transferred to the polysilicon 250. As an example, the lines 206 may be used to form word lines in a memory array of a non-volatile storage device.

Returning again to the photomask 108 of FIG. 2A, the photomask 108 includes rows (x-direction) and columns (y-direction) of islands 202 for printing the lines 206 in the pattern 125. An island 202 may be opaque such that it blocks radiation. In this example, one column of islands 202 is used to print each line 206. The photomask 108 includes a first region 205a of islands 202 for printing the first group of lines 206 and a second region 205b of islands 202 for printing the second group of lines 206.

The photomask 108 has assist features 204 in region 223 between the first and second regions 205a, 205b. An assist feature 204 may be clear such that it passes radiation. In one embodiment, each row of islands 202 is aligned with a row of assist features 202. In this example, the assist features 204 are holes. The holes may be sub-resolution. For example, the holes may have a size that is below the resolution of the photography system 100. Note that pattern 125 of FIGS. 2C and 2D has a solid block 210 between the lines 206. This block 210 corresponds to the region 223 with the assist features 204. Note that the assist features 204 do not allow enough radiation to pass through to significantly impact the photoresist.

The illumination intensity 208 diagram of FIG. 2B shows why the assist features 204 do not significantly impact the photoresist. The illumination intensity 208 diagram depicts the intensity of radiation in the image that arrives at the wafer 112. The graph depicts illumination intensity 208 along the x-axis for a given row of islands 202 and holes 204. The highest peaks in intensity correspond to the spaces between columns of islands 202. For example, peak 213 corresponds to a space between two columns of islands 202. The valleys between the highest peaks correspond to the columns of islands 202. For example, valley 215 corresponds to a column of islands 202. The intensity peaks that are below line 211 correspond to the columns of assist features 204. For example, peak 217 corresponds to a column of assist features.

If the illumination intensity is sufficiently high, then the photoresist may be developed and used as a mask to form a pattern when etching layers below the photoresist. For example, if the radiation intensity is below line 211, then the intensity might not be great enough to form lines 206 in photoresist. Because the peaks of the illumination intensity that correspond to the assist region 206 is not very high, a pattern should not be formed in the photoresist for that region. However, note that the illumination intensity is quite high in locations that correspond to spaces between columns of islands 202. On the other hand, the illumination intensity is relatively low in regions corresponding to columns of islands 202. Therefore, a pattern of lines 206 and spaces may be formed in the photoresist. Note that all along a column of islands 202, the illumination intensity should be relatively low due to dipole illumination. That is, whether the y-position corresponds to an island 202 or a space between two islands, the illumination intensity should be relatively low.

Figure 3:
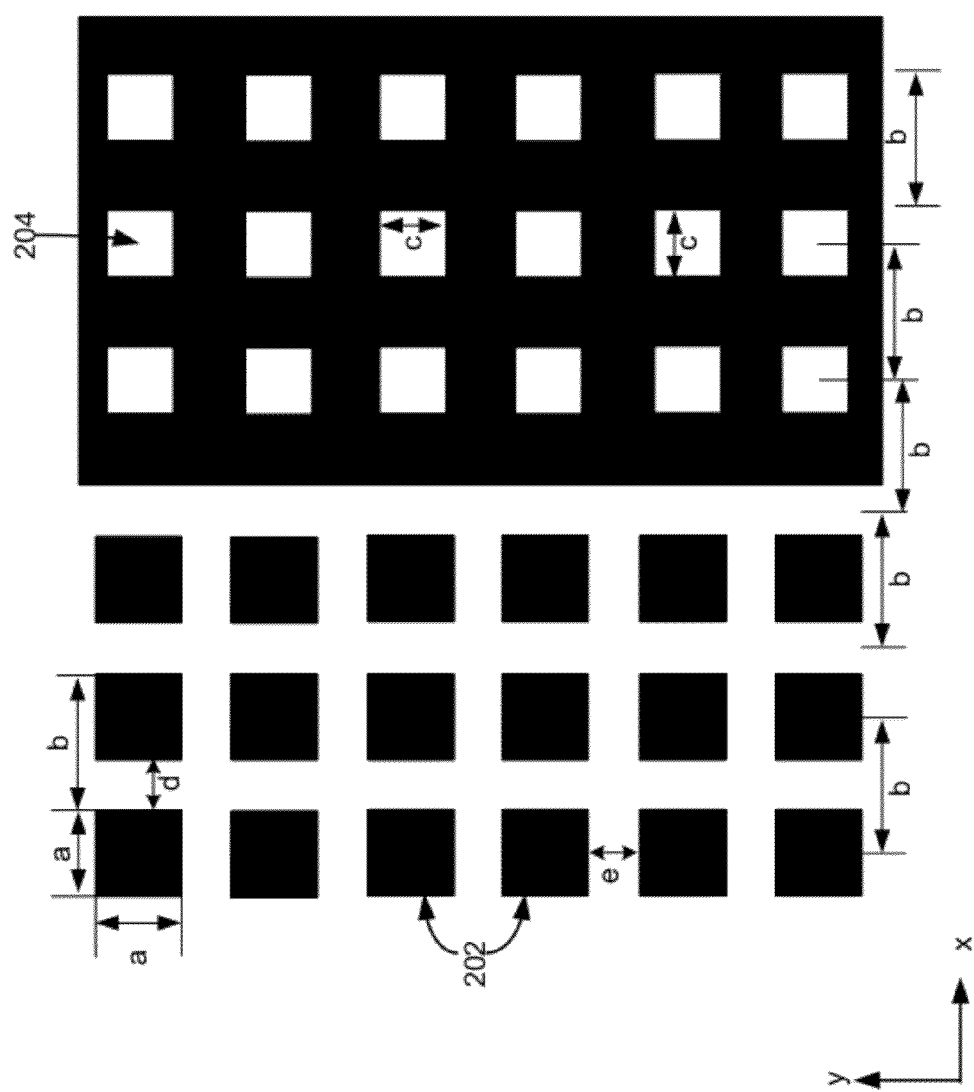
FIG. 3 depicts a portion of the photomask of FIG. 2A to show relative dimensions of elements in the photomask.

FIG. 3 depicts a portion of the photomask 108 of FIG. 2A to show relative dimensions of elements in the photomask 108. In this example, the islands 202 have a dimension of "a" in both the x- and y-direction. Thus, the islands 202 are substantially square in this example. It is not required that the islands 202 be square. Other shapes such as rectangles, and polygons with more or fewer than four sides are possible. The corners of the islands 202 may have some amount of rounding.

The islands 202 are separated by the distance "b" along the x-axis. That is, the distance is "b" between the centers of islands 202 along the x-axis. Also, the distance is "b" from the edge of one island 202 to the far edge of the adjacent island 202. The distance "b" is suitable to print lines having a desired pitch given the photolithography system in use. For example, "b" may be suitable to print lines 206 having a pitch of 76 nanometers (nm). Also mentioned, "b" may be greater than 76 nm due to the fact that optics in the photolithography system 100 may reduce the image from the photomask 108.

The assist features 204 are also separated by the distance "b" in the x-direction in this example. For example, the distance between the centers of two adjacent assist features 204 along the x-direction is "b". Likewise, it is "b" between the edge of one assist feature 204 and the far edge of the neighboring assist feature 204. Thus, the x-axis separation between assist features 204 is similar to the x-axis separation between islands 202.

Moreover, the assist features 204 are located in a way to assist printing lines 206. To assist in printing the lines 206, the assist features 204 are located a distance n*b away from the spaces between columns of islands 202, where n is an integer. For example, the centers of the assist features 204 that are closest to the islands 202 are 2*b away from the space between the nearest two columns of islands 202 and are 2*b away from the space between the next two columns of islands 202. The centers of other assist features 204 are also n*b away from spaces between columns of islands 202.

The size of the assist features 204 is "c" in both the x- and y-direction in this example. However, the assist features 204 are not required to be square. For example, the assist features 204 could be polygons with more or fewer than four sides. Also, the corners of the assist features 204 could be rounded. Furthermore, the assist features 204 might have an irregular shape. In one embodiment, "c" is less that $\lambda/2$, where $\lambda$ is the wavelength of the radiation from the radiation source 102. For example, if $\lambda$=193 nm, then "c" should be less than 96.2 nm, otherwise the assist features 204 may print on wafer 112.

An island 202 is separated from its neighbor island 202 by a gap of "d" in the x-direction. Note that a+d=b. An island 202 is separated from its neighbor island 202 by a gap of "e" in the y-direction. In one embodiment, "e" is less that $\lambda/2$, where $\lambda$ is the wavelength of the radiation from the radiation source 102. For example, if $\lambda$=193 nm, then e should be significantly less than 96.2 nm.

In one embodiment, the relative dimensions are as follows.
a=48 nm
b=76 nm
d=28 nm
c=38 nm
e=28 nm In one embodiment, the gap "e" between islands 202 is less than ½ the wavelength of radiation used in the dipole illumination system.

Figure 4A:
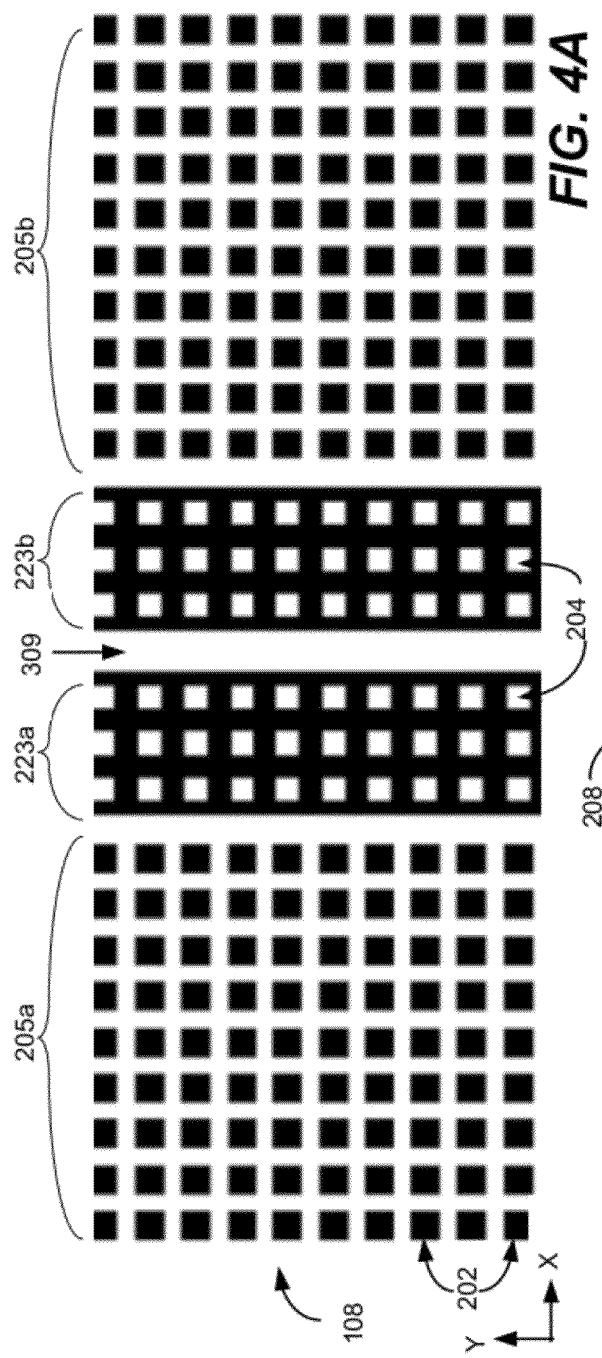
FIG. 4A depicts one embodiment of a photomask.

FIG. 4A depicts one embodiment of a photomask 108. The photomask 108 may be used in a dipole illumination system in which the dipole axis is aligned along the x-axis as depicted in FIG. 1C. The photomask 108 is similar to the one of FIG. 2A; however, in this case the assist features 204 are divided into two separate regions 223a, 223b separated by an opening 309.

The islands 202 may have a similar configuration to the example discussed in connection with FIG. 3. Likewise, the assist features 204 may have a similar configuration to the example discussed in connection with FIG. 3. Note that the gap between the center of an assist feature 204 and the center of the space between two adjacent columns of islands 202 may be n*b. In this example, b is the distance between centers of islands 202 and n is an integer.

Figure 4B:
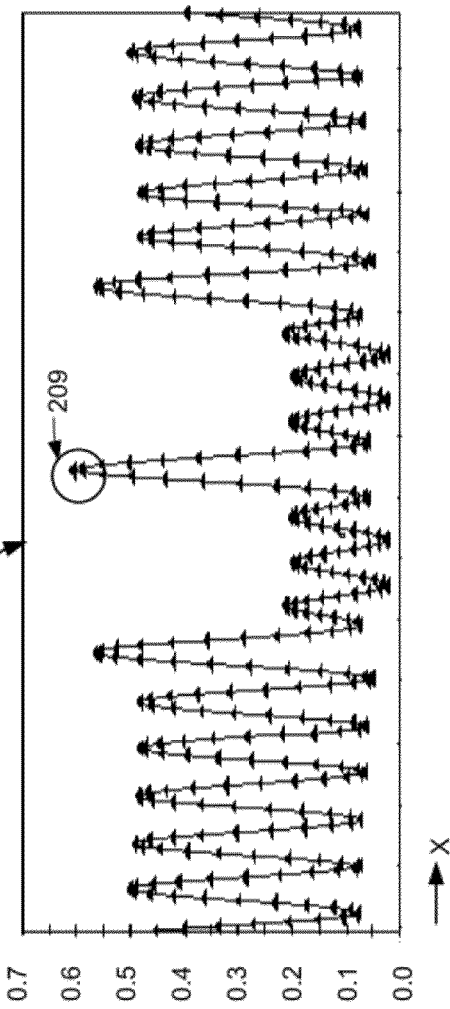
FIG. 4B depicts relative illumination intensity of the image from the photomask of FIG. 4A.

FIG. 4B depicts illumination intensity 208 that may result from the photomask 108 of FIG. 4A. FIG. 4B depicts the illumination intensity 208 along the x-axis. Note that peak 209 corresponds to the opening 309 between region 223a and 223b in the assist region of the photomask 108. The intensity of the peak 209 is sufficient to use region 223a and 223b to form two relatively wide lines. Thus, the width of the opening 309 is selected based on the desired gap between two lines formed in the wafer 112.

Figure 4C:
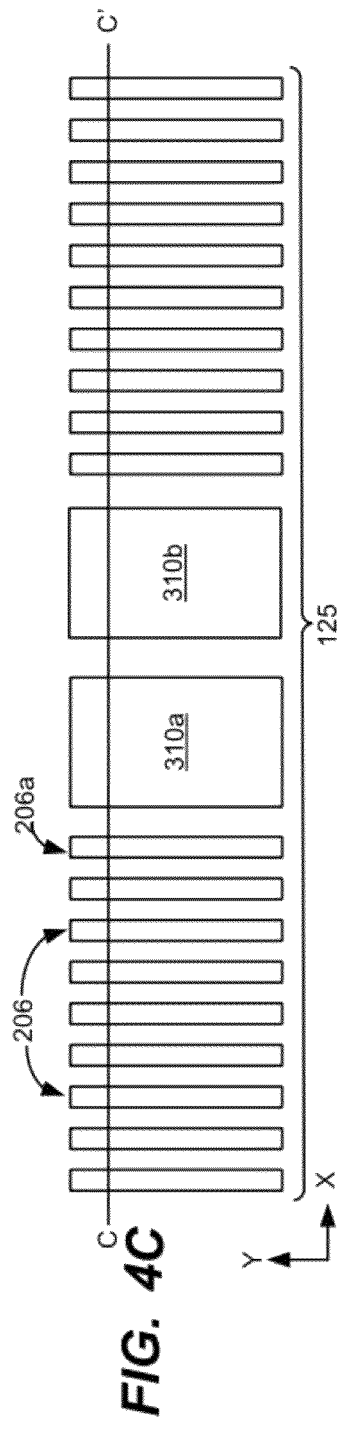
FIGS. 4C and 4D depict an example pattern that may be formed in a wafer using the photomask of FIG. 4A.
Figure 4D:
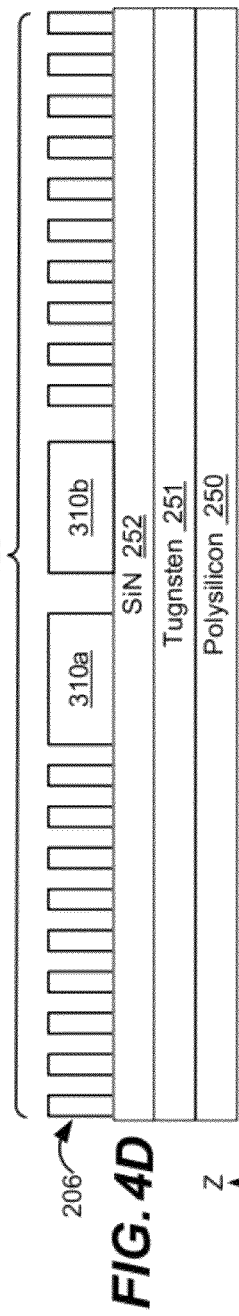

FIGS. 4C and 4D depict an example pattern 215 that may be formed in a wafer 112 using the photomask 108 of FIG. 4A. FIG. 4C is a top perspective view showing densely spaced lines 206 which are aligned in the y-direction. Note that the lines 206 are aligned perpendicular to the x-axis. Therefore, the lines 206 are aligned perpendicular to the dipole axis. In this example, there are two groups of lines 206 separated by two region 310a, 310b therebetween. Region 310a results from region 223a of the photomask 108 of FIG. 4A and region 310b results from region 223b of the photomask 108.

FIG. 4C depicts only the top photoresist layer. FIG. 4D is a cross-section taken along line C-C' of FIG. 4C. The topmost layer in FIG. 4D represents the pattern 125 formed in photoresist, which overlays a layer of SiN 252, a layer of tungsten 251, and a layer of polysilicon 250. The wafer 112 may have many more layers, or different layers, including layers between the depicted layers. Regions 310a and 310b may be used to print two features 310a, 310b in the wafer by the assist region.

Figure 4E:
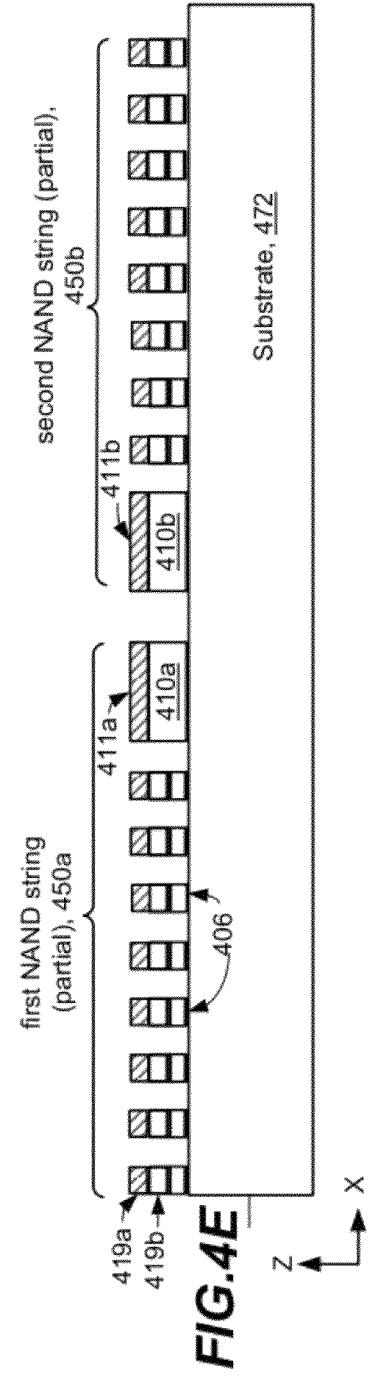
FIG. 4E depicts one possible structure, at least a part of which, may be formed using the pattern in the photoresist from FIG. 4D.

FIG. 4E depicts one possible structure, at least a part of which, may be formed using the pattern 215 in the photoresist from FIG. 4D. The structure includes a first partial NAND string 450a and a second partial NAND string 450b. Each NAND string 450 includes floating gates 406 and a select gate 410. Note that there may be many more floating gates 406 per NAND string. For example, there might be 64 floating gates 406 per NAND string 450. Each memory cell has a floating gate 406, which may be connected to a control line or word line 419a, 419b that extends in the y-direction. The word lines 419 may be formed based on the pattern 215. For example, lines 206 may be used to etch the tungsten 251 and polysilicon 250 to form word lines having a polysilicon layer 419b and a tungsten layer 419a. Note that when completed the floating gates 406 do not extend in the y-direction. However, early in the formation of the floating gates 406, they may extend in the y-direction. The select lines 410a, 410b may also be formed based on the pattern 125. Specifically, a select line may include a tungsten layer 411 formed by etching tungsten 251 and a polysilicon layer 410 formed by etching polysilicon 250 using region 310 as a mask. The select lines may extend in the y-direction.

FIG. 5 is a flowchart of one embodiment of a process 600 of forming a photomask 108. The process 600 may be used to form the example photomasks including, but not limited to the photomask in FIG. 2A, 3, or 4A. In step 602, a first region is defined in the photomask 108 that has an array of islands 202 for printing lines aligned in a direction that is perpendicular to an axis of poles in a dipole illumination system. For example, the first region can be the region 205a of FIG. 2A or 4A.

In step 604, a second region having a second pattern of rows and columns of assist openings 204 is formed in the photomask 108. The assist openings 204 may be sub-resolution. For example, an assist region 223 of FIG. 2A is formed. Alternatively, an assist region having two separate regions 223a, 223b such as in FIG. 4A is formed.

In step 606, a third region is defined in the photomask 108 that has an array of islands 202 for printing lines 206 aligned in a direction that is perpendicular to an axis of poles in a dipole illumination system 100. For example, the third region can be the region 205b in FIG. 2A or 4A.

Figure 6:
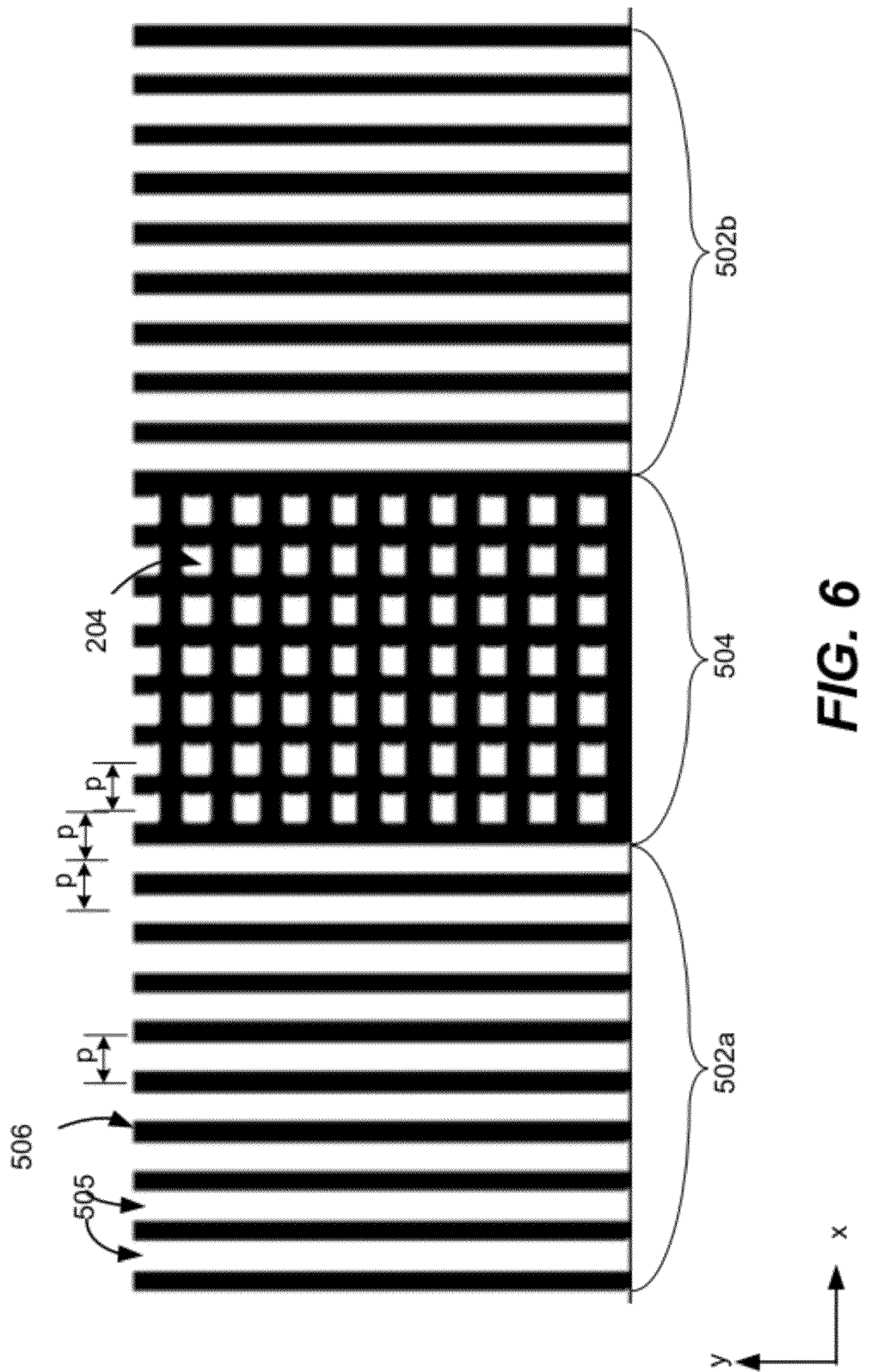
FIG. 6 depicts one embodiment of a photomask.

FIG. 6 depicts one embodiment of a photomask 108 having first region 502a and a second region 502b of lines 506 and spaces 505 for printing lines 206 in a wafer 112. The photomask 108 may be used in a dipole illumination system in which the dipole axis is aligned along the x-axis as depicted in FIG. 1C. The photomask 108 of FIG. 5 may be used to form a pattern 125 similar to the one in FIGS. 2C and 2D. Regions 502a and 502b each include alternating lines 506 and spaces 505. Thus, the region for printing lines does not include islands 202 in one embodiment. In one embodiment, the lines 506 are 32 nm wide and the spaces 505 are 44 nm wide. In one embodiment, the lines 506 and spaces 505 are used to print lines 206 that are 38 nm wide and have a pitch of 76 nm.

The photomask 108 has region 504 of assist features 204 that are for assisting in printing the lines 206. In one embodiment, the assist features 204 are 38 nm in both the x- and y-direction. The assist features 204 should be sub-resolution. Each line 506 is spaced p nm to the next line 506. Likewise, the assist features 204 are spaced apart by p nm. Therefore, the assist features 204 are located so as to assist in printing lines 206 in the wafer 112. For example, the distance from the center of an assist feature is n*p nm from the center of a space 505 (where n is an integer). Note that assist region 504 could be divided into two regions as in the photomask 108 of FIG. 4A.

Figure 7:
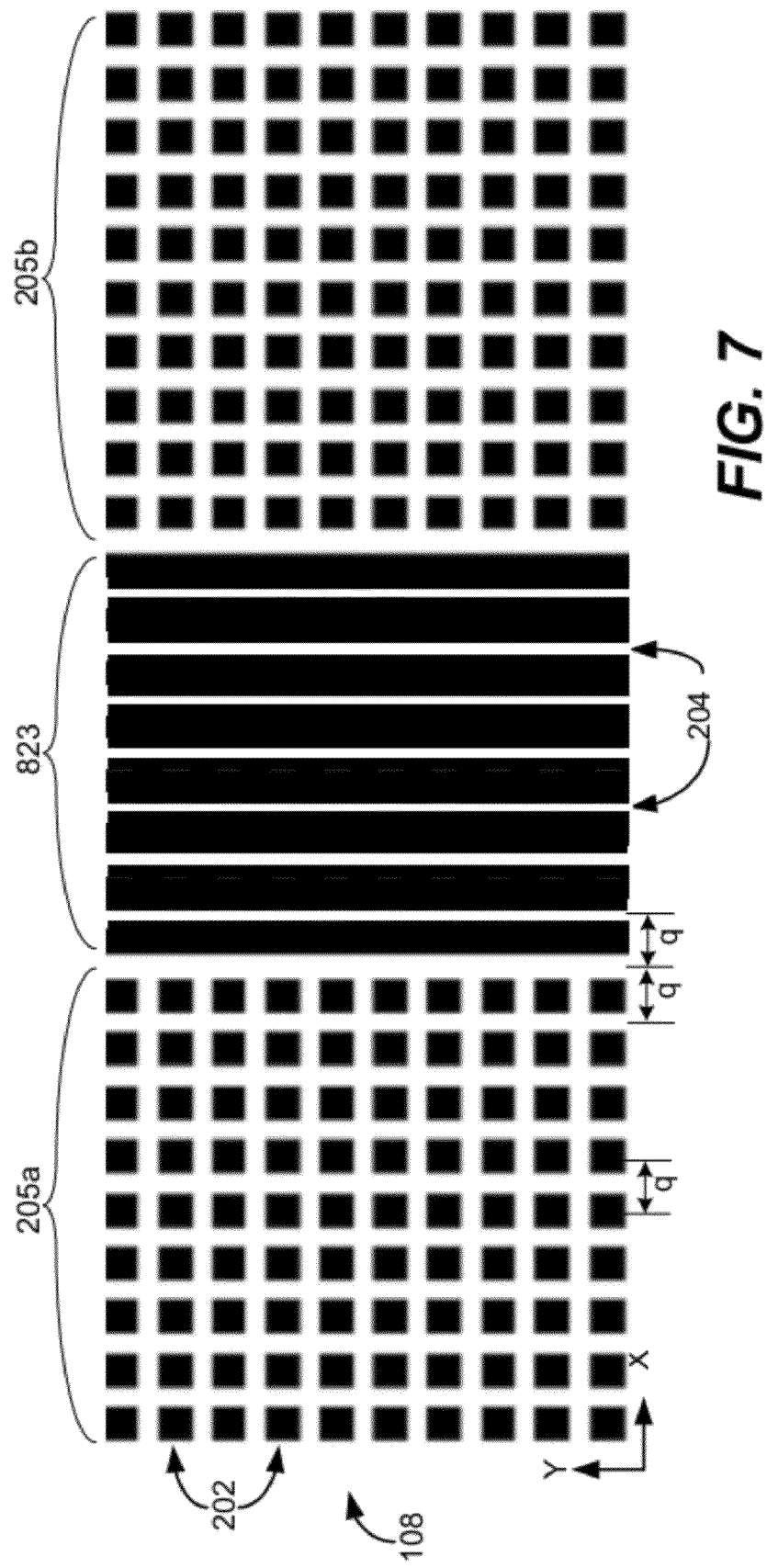
FIG. 7 is one embodiment of a photomask.

FIG. 7 is another embodiment of a photomask 108. The photomask 108 may be used in a photolithography system 100 that uses dipole illumination, such as the example system of FIG. 1A. The x-y axis in FIG. 7 shows one possible orientation of the photomask 108 relative to the dipole axis of FIG. 1C. The photomask 108 has first and second regions 205a, 205b of islands 202 for printing lines 206. The islands 202 may have a similar pattern as an embodiment of the photomask of FIG. 2A. Each line 506 is spaced q nm to the next line 506.

The photomask 108 has assist region 823 that includes assist features 204. In this embodiment, the assist features 204 are spaces between lines. The assist features 204 should be sub-resolution. The assist features 204 are spaced apart by q nm. Therefore, the assist features 204 are located so as to assist in printing lines 206 in the wafer 112. For example, the distance from the center of an assist feature is n*q nm from the center of a space between columns of islands (where n is an integer).

Figure 8:
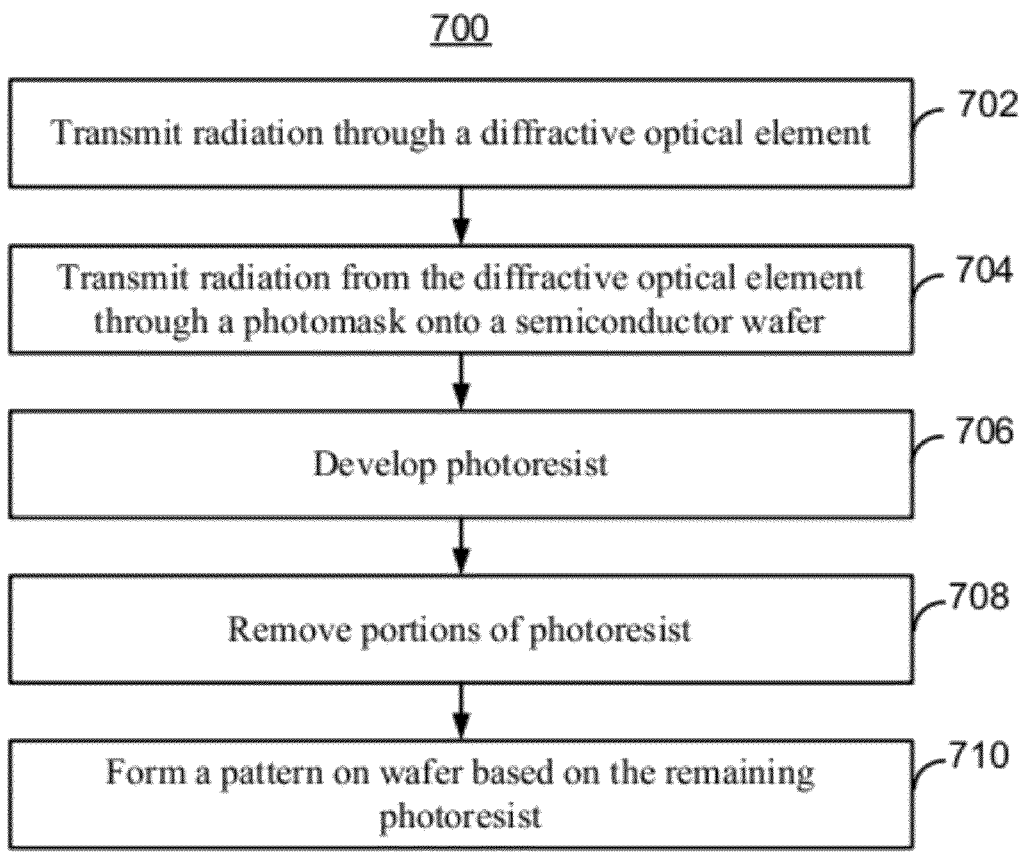
FIG. 8 is a flowchart of one embodiment of a process of forming features in a wafer using a photomask.

FIG. 8 is a flowchart of one embodiment of a process 700 of forming features in a wafer 112 using a photomask 108. Process 700 will be discussed with reference to the photolithography system 100 of FIG. 1A, but is not so limited. A photomask 108 such as the ones in FIG. 2A, 4A, 6, or 7 may be used in process 700. In one embodiment, the photomask 108 is a variation of the one in FIG. 2A that includes a first region 205a, but does not necessarily include an assist region 206 or a second region 205b. Prior to process 700 is assumed that the wafer 112 already has a layer of photoresist and other materials below the photoresist in which to form a pattern 125.

In step 702, radiation is transmitted through a diffractive optical element (DOE) 104. In one embodiment, the DOE 104 is a dipole aperture plate. For the sake of discussion, the dipole axis of the DOE 104 will be assumed to be aligned with the x-axis at this point.

In step 704, radiation is transmitted from the DOE 104 through the photomask 108 into a semiconductor wafer 112. For example, the radiation that passed through the DOE 104 is passed through the condenser lens 106, through the photomask 108, through the projection lens 110, and onto the wafer 112.

In step 706, the photoresist on the wafer 112 is developed. Techniques for developing photoresist are well known and will not be discussed. In step 708, portions of the photoresist are removed to reveal a pattern. Examples of patterns are depicted in FIGS. 2C, 2D, 4C and 4D. This pattern may have features that are substantially perpendicular to features in the pattern in the photomask 108. For example, the lines 206 in FIG. 2C are aligned in the y-direction, which is substantially perpendicular to the x-direction.

In step 710, the pattern is formed in the wafer 112 based on the remaining photoresist. For example, referring to the structure of FIG. 2D, the remaining photoresist is used as a mask when etching the SiN 252. Then, the SiN 252 is used as a mask when etching the polysilicon 250. FIG. 4E depicts one example of a structure that is formed in the wafer based on the pattern 125 in the photoresist. As an example, the pattern could include word lines 419 and control select lines 410, 411 in a memory array. After step 710, process 700 may conclude.

Figure 9:
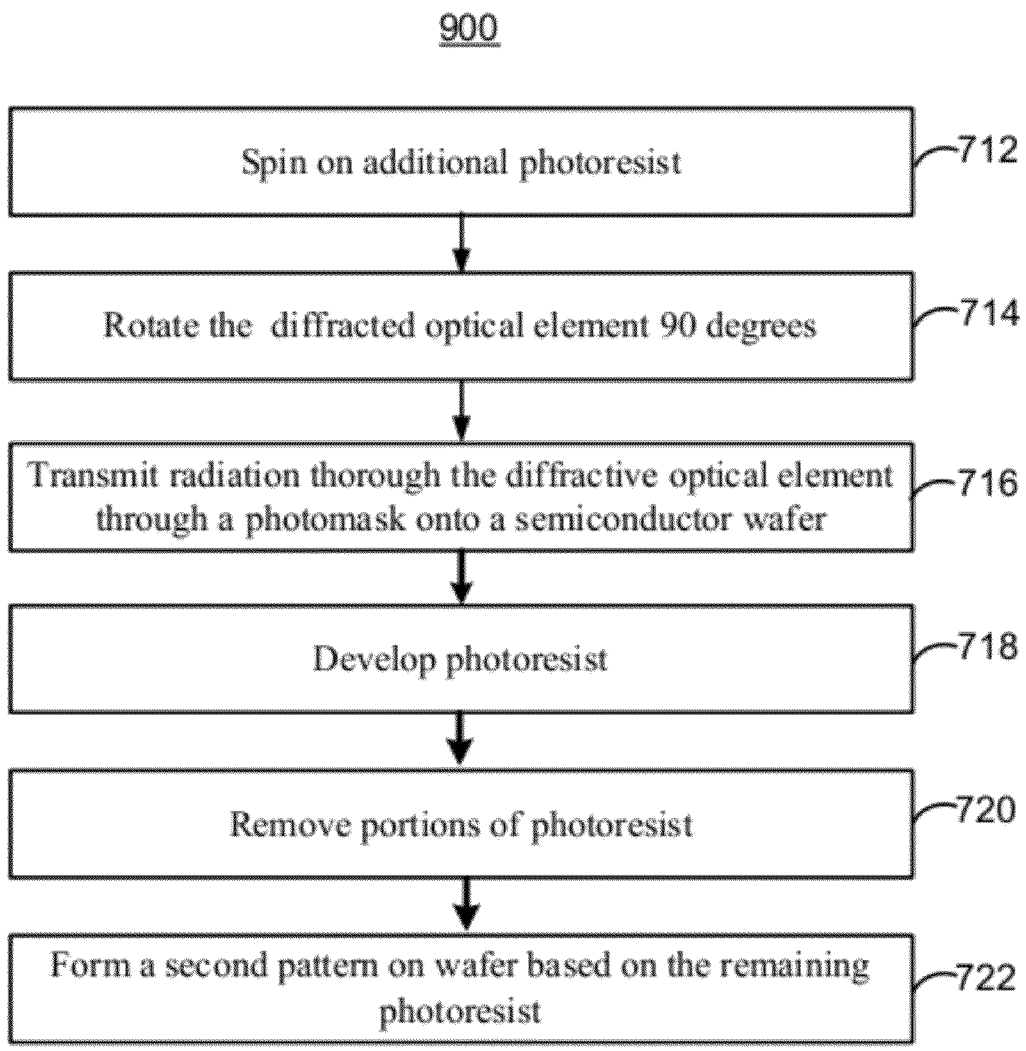
FIG. 9 is a flowchart of one embodiment of a process of forming features that are aligned perpendicular to features in the pattern formed by the process of FIG. 8.

In one embodiment, the same photomask 108 is used to form additional features that are aligned perpendicular to features in the first pattern formed by process 700. FIG. 9 is a flowchart of one embodiment of a process 900 of forming features that are aligned perpendicular to features in the first pattern formed by process 700. Process 900 is performed after performing process 700 of FIG. 8. In one embodiment, the photomask 108 used in process 900 includes a region such as region 205a of FIG. 2A, but does not necessarily include a region such as assist region 223 or region 205b. As one example, first the photomask 108 is used to form word lines in a memory array and then the photomask 108 is used to form bit lines in a memory array. Further details of forming word lines in a non-volatile storage element memory array are described in, U.S. Pat. No. 7,154,779, titled "Non-volatile Memory Cell Using High-K Material and Inter-Gate Programming, filed in Jan. 21, 2004, which is hereby incorporated by reference for all purposes. Further details of forming bit lines in a non-volatile storage element memory array are described in, U.S. Patent Publication 2009/0004843, titled "Method for Forming Dual Bit Line Metal Layers for Non-Volatile Memory, filed in Jan. 26, 2007, which is hereby incorporated by reference for all purposes.

In step 712, additional photoresist is added to the wafer 112. Note that additional materials might also be added to the wafer 112, such as additional materials to etch. For example, an insulator might be added in the spaces between the first pattern in the polysilicon. Then additional materials might be added over the insulator.

In step 714, the diffractive optical element 104 is rotated 90 degrees from its position in steps 702-704 of proceeds 700. For example, the diffractive optical element 104 may be rotated such that the dipole axis is aligned with the y-axis (see FIG. 1C). Note that neither the photomask 108 nor the wafer 112 needs to be rotated. In fact, the photomask 108 and the wafer 112 should be in the same relative orientations as in process 700. Thus, at this point the diffractive optical element 104 is rotated 90 degrees with respect to the photomask 108. Likewise, at this point the diffractive optical element 104 is rotated 90 degrees with respect to the wafer 112. Referring to FIG. 2A, the dipole axis will now be aligned along the y-axis instead of the x-axis. However, the islands 202 may still be used to print lines. In this case, however, a row of islands 202 will be used to print a line.

In step 716, radiation is transmitted though the diffractive optical element 104 and then through the photomask 108 onto the semiconductor wafer 112.

In step 718, the photoresist is developed. Techniques for developing photoresist are well known and will not be discussed. In step 720, portions of the photoresist are removed to reveal a second pattern. This second pattern may have features that are substantially perpendicular to features in the first pattern formed in process 700. For example, the first pattern might have lines 206 aligned in the y-direction as depicted in FIG. 2C. However, the second pattern might have lines aligned in the x-direction.

In step 722, the second pattern is formed in the wafer 112 based on the remaining photoresist. For example, the remaining photoresist is used as a mask when etching SiN. Then, the SiN is used as a mask when etching a material such as tungsten or polysilicon. As an example, the second pattern could be bit lines in a memory array. This concludes process 900.

One embodiment includes a photomask to be used for exposure of a semiconductor wafer using dipole illumination having poles aligned in a first axis. The photomask includes a first region having a first pattern of rows and columns of islands for printing lines aligned in a direction that is perpendicular to the first axis, the islands that are for printing a given line are spaced apart by less than ½ the wavelength of radiation used in the dipole illumination.

One embodiment includes a photomask to be used for exposure of a semiconductor wafer with dipole illumination having two aperture openings aligned in a first axis. The photomask includes a first region having features for printing dense lines aligned in a direction that is perpendicular to the first axis, the features having a pitch "x", and a second region having a pattern of rows and columns of sub-resolution assist openings for assisting in printing the dense lines, the sub-resolution assist openings are located at regular intervals along the rows in the pattern, the pitch of the sub-resolution assist openings is equal to the pitch of the features.

One embodiment is a method of manufacturing a photomask to be used for exposure of a semiconductor wafer with dipole illumination having poles aligned in a first axis. The method includes defining a first region having a first pattern of rows and columns of islands for printing lines aligned in a direction that is perpendicular to the first axis. The islands that are for printing a given line are spaced apart by less than ½ the wavelength of radiation used in the dipole illumination.

One embodiment is a method of forming a pattern on a semiconductor. The method includes transmitting radiation through a diffractive optical element having a dipole axis, transmitting the radiation from the diffractive optical element through a photomask unto a semiconductor substrate having a photoresist. The photomask having a first region having a first pattern of rows and columns of islands. The islands have a space between them along a given column, the space is less than ½ the wavelength of the radiation. The method further includes developing the photoresist, and removing portions of the photoresist after developing to reveal lines formed in the photoresist, the lines are perpendicular to the dipole axis.

One embodiment is a method of manufacturing a photomask to be used for exposure of a semiconductor wafer with dipole illumination having poles aligned in a first axis. The method includes defining a first region having features for printing dense lines aligned in a direction that is perpendicular to the first axis, the features having a pitch "x", and defining a second region having a pattern of rows and columns of sub-resolution assist openings for assisting in printing the dense lines. The sub-resolution assist openings are located at regular intervals along the rows in the pattern. The pitch of the sub-resolution assist openings is equal to the pitch of the features.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A photomask to be used for exposure of a semiconductor wafer using dipole illumination having poles aligned in a first axis (x-axis), the photomask comprising:
    a first region having a first pattern of rows and columns of islands for printing lines aligned in a direction that is perpendicular to the first axis, the islands that are for printing a given line are spaced apart by less than ½ the wavelength of radiation used in the dipole illumination; and
    a second region next to the first region and having a second pattern of rows and columns of sub-resolution assist openings.

2. The photomask of claim 1, wherein the islands in a column are for printing lines, the islands in a row are equally spaced apart, centers of the islands in a row are separated by a distance "x."

3. The photomask of claim 2, wherein:
    the sub-resolution assist openings are located at regular intervals along the rows in the second pattern, centers of the sub-resolution assist openings are separated by the distance "x" along the rows in the second pattern.

4. The photomask of claim 3, wherein:
the distance from the center of a sub-resolution assist opening to a center of a space between adjacent columns of the islands is an integer multiple of "x."

5. The photomask of claim 3, wherein the rows of islands are aligned with the rows of sub-resolution openings.

6. The photomask of claim 3, further comprising:
a third region having the first pattern of rows and columns of islands for printing lines aligned in the direction that is perpendicular to the first axis, the second region is located between the first region and the third region, the sub-resolution assist openings are further for preventing distortion of lines that will print if the radiation is passed through the third region.

7. The photomask of claim 3, wherein the second region comprises two of the second patterns separated by an opening, the second region is for printing two lines aligned in the direction that is perpendicular to the first axis, the two lines are defined by the two second patterns.

8. The photomask of claim 1, wherein the second region includes a second pattern of columns of lines with sub-resolution assist openings between the lines, the sub-resolution assist openings for preventing distortion of the lines printed as a result of the first pattern, neighboring sub-resolution assist openings are separated by the distance "x".

9. A photomask to be used for exposure of a semiconductor wafer with dipole illumination having two aperture openings aligned in a first axis, the photomask comprising:
a first region having features for printing dense lines aligned in a direction that is perpendicular to the first axis, the features having a pitch "x";
a second region having a pattern of rows and columns of sub-resolution assist openings for assisting in printing the dense lines, the sub-resolution assist openings are located at regular intervals along the rows in the pattern, the pitch of the sub-resolution assist openings is equal to the pitch of the features; and
a third region having features for printing dense lines aligned in the direction that is perpendicular to the first axis, the second region is located between the first region and the third region.

10. The photomask of claim 9, wherein the first region comprises:
lines and openings between the lines, the lines and openings for printing the dense lines.

11. The photomask of claim 9, wherein the second region comprises:
an opening that separates two of the patterns, the second region is for printing two lines aligned in the direction that is perpendicular to the first axis, the two lines are defined by the two patterns.

12. A method of manufacturing a photomask to be used for exposure of a semiconductor wafer with dipole illumination having poles aligned in a first axis, the method comprising:
defining a first region having a first pattern of rows and columns of islands for printing lines aligned in a direction that is perpendicular to the first axis, the islands that are for printing a given line are spaced apart by less than ½ the wavelength of radiation used in the dipole illumination; and
defining a second region next to the first region and having a second pattern of rows and columns of sub-resolution assist openings.

13. The method of claim 12, wherein the islands in a column are for printing lines, the islands in a row are equally spaced apart, centers of the islands in a row are separated by a distance "x."

14. The method of claim 13, wherein:
the sub-resolution assist openings are located at regular intervals along the rows in the second pattern, centers of the sub-resolution assist openings are separated by the distance "x" along the rows in the second pattern.

15. The method of claim 14, wherein the rows of islands are aligned with the rows of sub-resolution openings.

16. The method of claim 14, further comprising:
defining a third region having the first pattern of rows and columns of islands for printing lines aligned in the direction that is perpendicular to the first axis, the second region is located between the first region and the third region, the sub-resolution assist openings are further for preventing distortion of the lines that will print if the radiation is passed through the third region.

17. The method of claim 14, wherein defining the second region comprises:
defining an opening that separates two of the second patterns, the second region is for printing two lines aligned in the direction that is perpendicular to the first axis, the two lines are defined by the two second patterns.

18. The method of claim 13, wherein:
the sub-resolution assist openings are for preventing distortion of the lines that will print as a result of the first pattern, neighboring sub-resolution assist openings are separated by the distance "x".

19. A method of forming a pattern on a semiconductor, the method comprising:
transmitting radiation through a diffractive optical element having a dipole axis;
transmitting the radiation from the diffractive optical element through a photomask unto a semiconductor substrate having a photoresist, the photomask having a first region having a first pattern of rows and columns of islands, the islands have a space between them along a given column, the space is less than ½ the wavelength of the radiation, the photomask having a second region having a second pattern of rows and columns of sub-resolution assist openings for preventing distortion of the lines formed in the photoresist, the sub-resolution assist openings are located at regular intervals along the rows in the second pattern;
developing the photoresist; and
removing portions of the photoresist after developing to reveal lines formed in the photoresist, the lines are perpendicular to the dipole axis.

20. The method of claim 19, further comprising:
rotating the diffractive optical element by 90 degrees after transmitting the radiation through the dipole aperture;
transmitting radiation through the diffractive optical element after the rotating, the photoresist is a first photoresist, the pattern is a first pattern, the lines are first lines;
transmitting radiation from the rotated diffractive optical element through the photomask unto the semiconductor substrate having a second photoresist;
developing the second photoresist; and
removing portions of the second photoresist after developing to reveal second lines formed in the second photoresist, the second lines are perpendicular to the dipole axis of the diffractive optical element, the second lines are perpendicular to the first lines.

21. The method of claim 19, wherein:
the islands in a row are equally spaced apart, centers of the islands in a row are separated by a distance "x", centers of the sub-resolution assist openings are separated by the distance "x" along the rows in the second pattern.

22. The method of claim 19, further comprising:
forming lines in a material on the semiconductor substrate based on the lines in the photoresist.

23. A method of manufacturing a photomask to be used for exposure of a semiconductor wafer with dipole illumination having poles aligned in a first axis, the method comprising:
defining a first region having features for printing dense lines aligned in a direction that is perpendicular to the first axis, the features having a pitch "x"; and
defining a second region having a pattern of rows and columns of sub-resolution assist openings for assisting in printing the dense lines, the sub-resolution assist openings are located at regular intervals along the rows in the pattern, the pitch of the sub-resolution assist openings is equal to the pitch of the features; and a third region having features for printing dense lines aligned in the direction that is perpendicular to the first axis, the second region is located between the first region and the third region.

24. The method of claim 23, wherein the first region comprises:
lines and openings between the lines, the lines and openings for printing the dense lines.

25. A photomask comprising:
a first region having a first pattern of rows and columns of islands for printing first lines;
a second region having the first pattern of rows and columns of islands for printing second lines parallel to the first lines; and
a third region between the first region and the second region, the third region having two areas of rows and columns of sub-resolution assist openings, the two areas separated by an opening, the third region for printing two lines parallel to the first and second lines.

* * * * *